United States Patent
Maari

[11] Patent Number: 5,925,917
[45] Date of Patent: Jul. 20, 1999

[54] CONTACT PROGRAMMABLE ROM AND METHOD OF MANUFACTURING THE SAME

[75] Inventor: Koichi Maari, Kanagawa, Japan

[73] Assignee: Sony Corporation, Tokyo, Japan

[21] Appl. No.: 08/926,713

[22] Filed: Sep. 10, 1997

Related U.S. Application Data

[63] Continuation of application No. 08/518,328, Aug. 23, 1995, abandoned.

[30] Foreign Application Priority Data

Aug. 24, 1994 [JP] Japan ................................ P06-222475

[51] Int. Cl.$^6$ .............................. H01L 29/76; H01L 29/94
[52] U.S. Cl. ......................... 257/390; 257/314; 257/315; 257/383; 257/336; 257/763
[58] Field of Search ..................................... 257/368, 382, 257/383, 390, 763, 314, 315, 336

[56] References Cited

U.S. PATENT DOCUMENTS

| | | | |
|---|---|---|---|
| 4,748,492 | 5/1988 | Iwase et al. ............................. | 257/390 |
| 5,196,910 | 3/1993 | Moriuchi et al. ........................ | 257/390 |
| 5,233,210 | 8/1993 | Kodama .................................. | 257/315 |
| 5,306,952 | 4/1994 | Matsuura et al. ........................ | 257/763 |
| 5,313,101 | 5/1994 | Harada et al. ........................... | 257/763 |
| 5,357,136 | 10/1994 | Yoshioka ................................. | 257/383 |
| 5,381,046 | 1/1995 | Cederbaum et al. .................... | 257/760 |
| 5,519,239 | 5/1996 | Chu ........................................ | 257/314 |

*Primary Examiner*—Valencia Martin-Wallace
*Attorney, Agent, or Firm*—Hill & Simpson

[57] ABSTRACT

This invention provides contact programmable ROM which shortens TAT.

The manufacturing process comprises two steps of: (a) a step in which a plurality of memory cells having gate region 14 and source/drain regions 15A and 15B is formed on a semiconductor substrate, the first interlayer insulating layer 20 is formed on the whole surface, the first opening 21 is formed on the first interlayer insulating layer 20 above one source/drain region 15A of each memory cell, metal interconnect material 22 is filled in the first opening 21 to from a contact hole, and the second interlayer insulating layer 23 is formed over the metal interconnect material 22 and first interlayer insulating layer 20, and (b) a step in which the second opening 24 is formed on the second interlayer insulating layer 23 above the contact hole of specified memory cells, and interconnecting layer 25 is connected electrically to the contact hole is formed over the second interlayer insulating layer 23.

7 Claims, 7 Drawing Sheets

FIG. 1A [PROCESS-100]
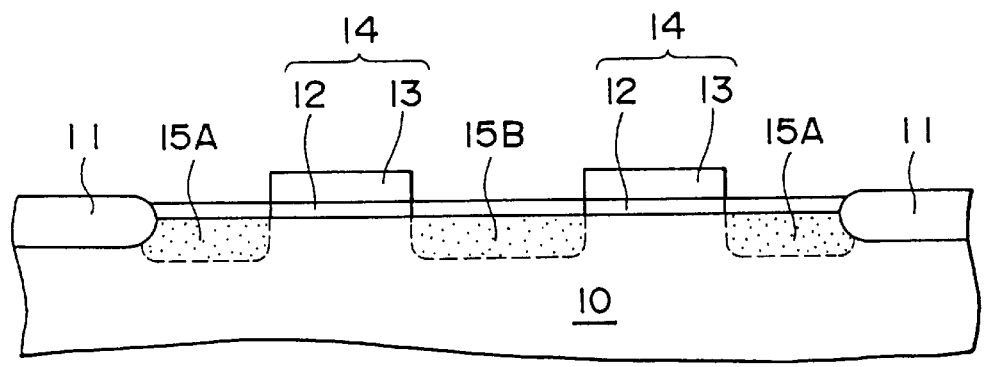
FIG. 1B [PROCESS-120]
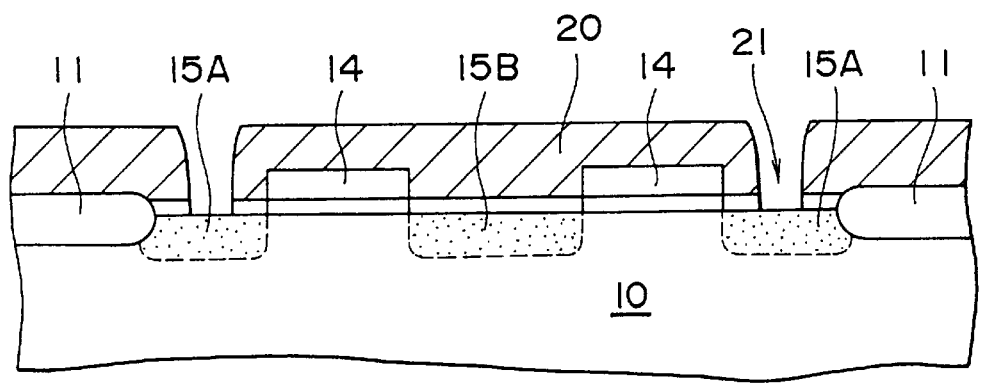
FIG. 1C [PROCESS-130]
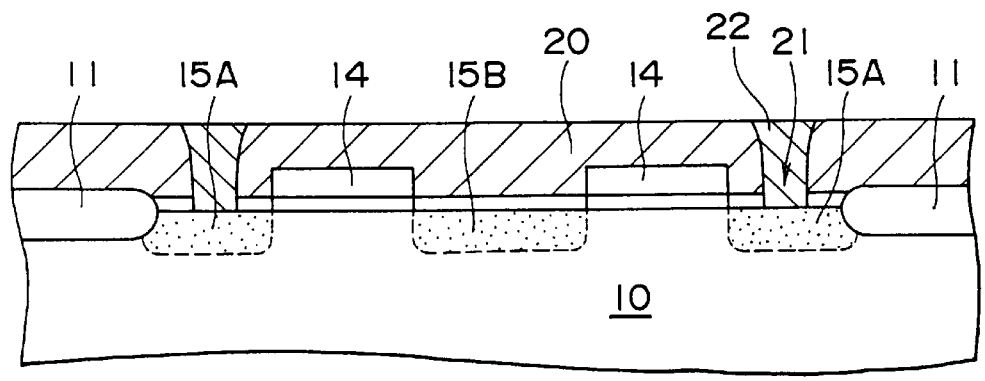

FIG. 2A [PROCESS-140]
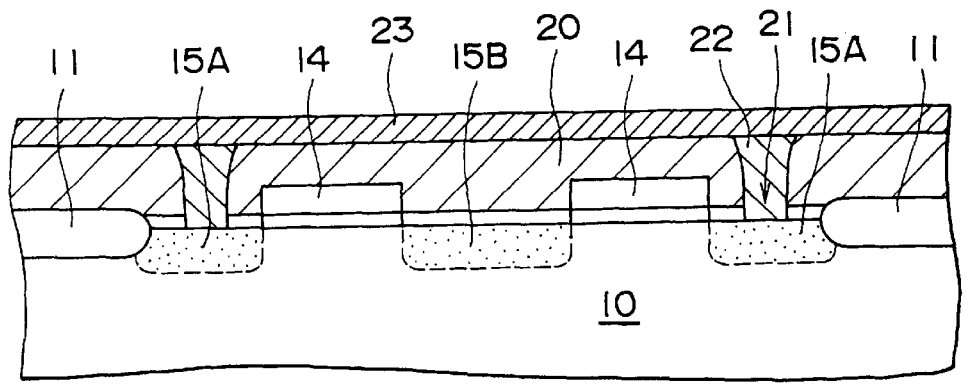
FIG. 2B [PROCESS-150]
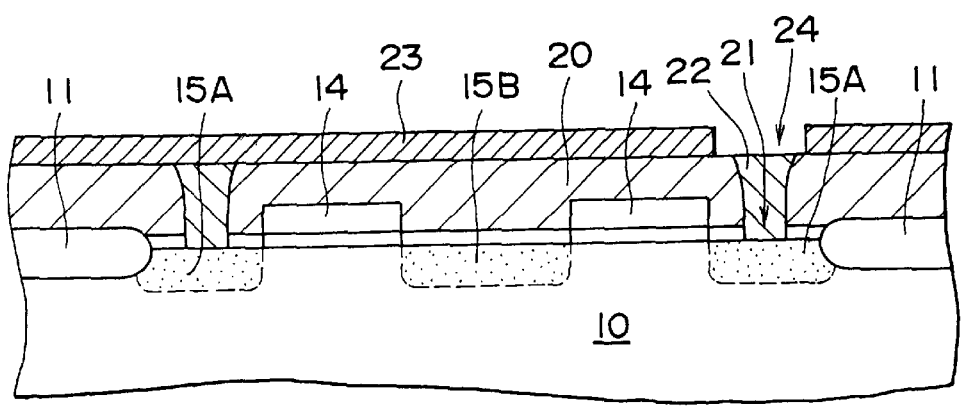
FIG. 2C [PROCESS-160]
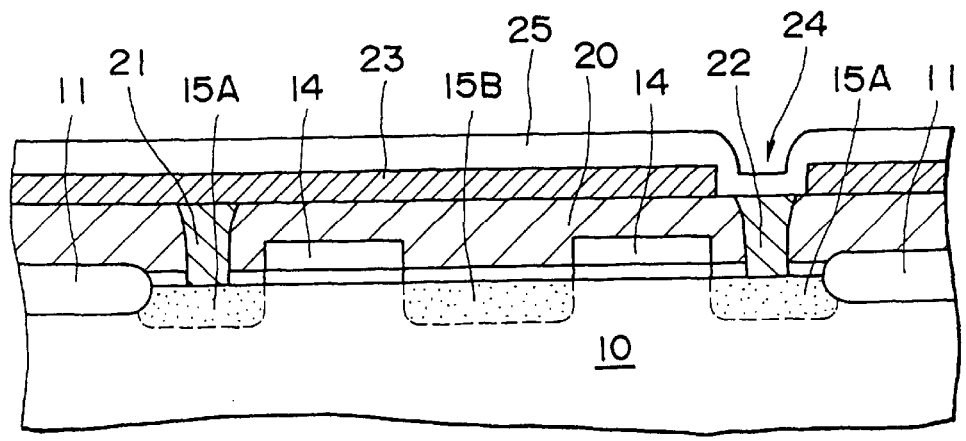

F I G. 3A  [PROCESS-10]
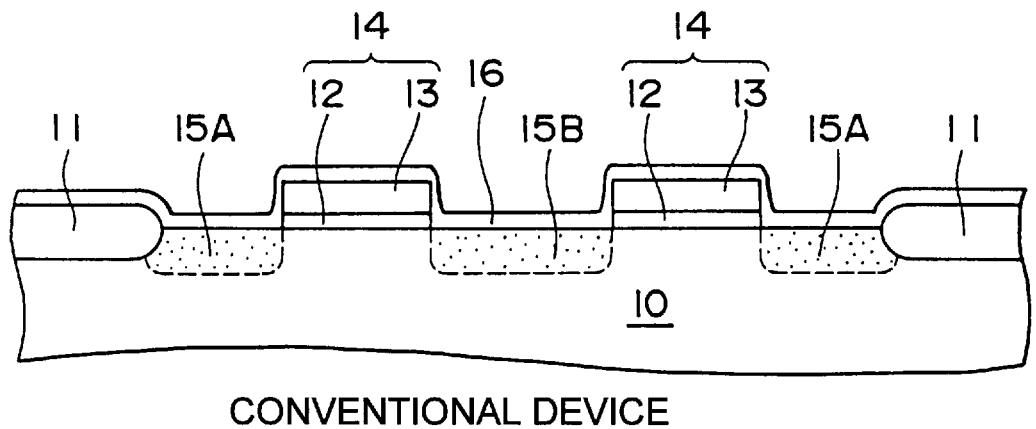
CONVENTIONAL DEVICE
F I G. 3B  [PROCESS-20]
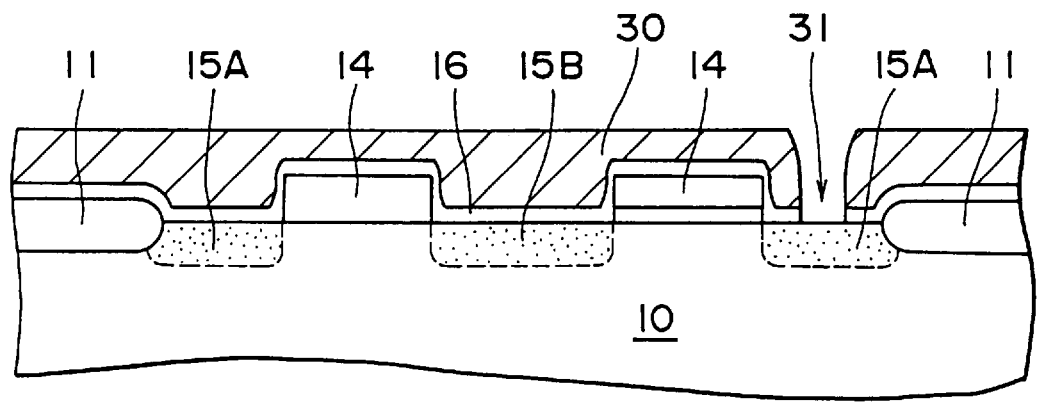
CONVENTIONAL DEVICE FIG. 4A [PROCESS-30]
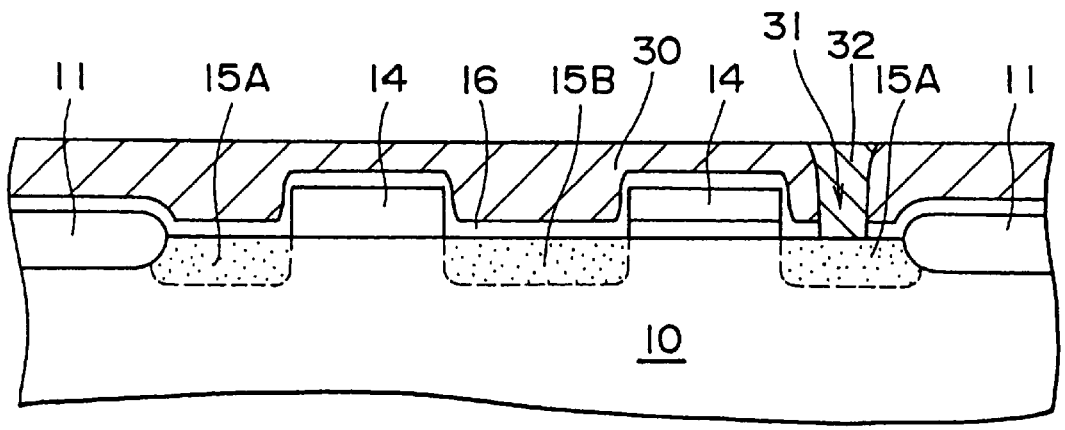
CONVENTIONAL DEVICE
FIG. 4B [PROCESS-40]
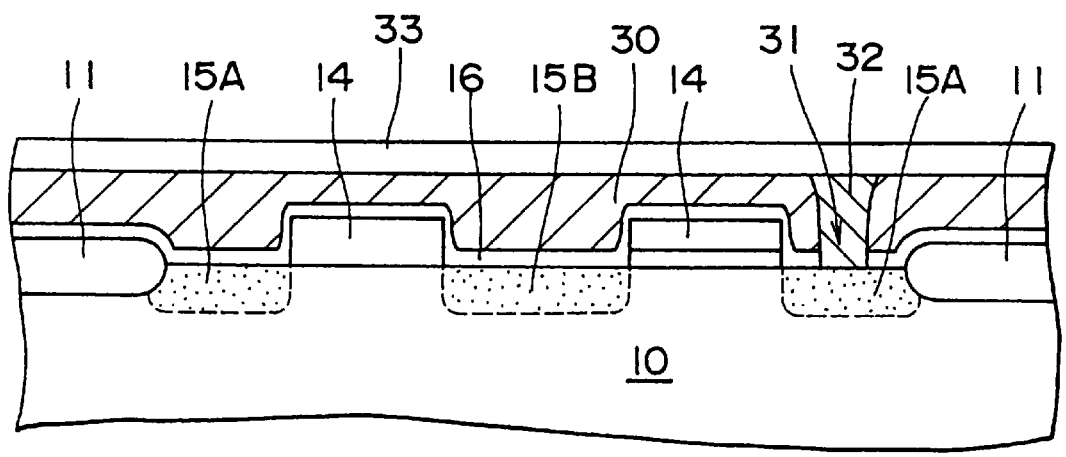
CONVENTIONAL DEVICE

CONTACT PROGRAMMABLE ROM AND METHOD OF MANUFACTURING THE SAME

This is a continuation, of application Ser. No. 08/518, 328, filed Aug. 23, 1995 now abandoned.

BACKGROUND OF THE INVENTION

1. Field of the Invention

The present invention relates to a contact programmable ROM having a new structure and a method of manufacturing the same. The contact programmable ROM refers to a ROM (read only memory) in which whether a contact hole is electrically connected to an interconnecting layer or not corresponds to whether the logical state of the memory cell is "0" or "1".

2. Description of Related Art

A ROM is a type of nonvolatile memory cell. The structure of a memory cell of a mask ROM does not require any special semiconductor device manufacturing processes in manufacturing, therefore the mask ROM is advantageous in process economy, and no requirement of writing operation allows a simplified circuit structure as a whole, therefore it is advantageous for realization of a large-capacity memory. However, the mask ROM is disadvantageous due to long turn around time (time for delivery from a semiconductor manufacturer to a user) compared to an EPROM. Diffusion layer programming, ion implantation, and contact programming are types of ROM manufacturing process, among these processes, contact programming is a process in which a programming process is provided near the final process of semiconductor device manufacturing process, the contact programming system is a process which can realize the shortest TAT.

A plane view and an equivalent circuit of a contact programmable ROM which are formed when projected on a plane are shown in FIGS. 6A and 6B. In a contact programmable ROM, information is stored in a memory depending on whether one source/drain region is connected to bit lines or not. That is, in a situation that one source/drain region is connected to a bit line, when a transistor of a memory cell is turned on, charge on a bit line discharges to read a "0" level information. On the other hand, In a situation that one source/drain region is not connected to a bit line, when a transistor of a memory cell is turned on, charge on a bit line is held to read a "1" level information. Another source/drain region of each memory is connected to common Vss (GND).

The outline of a manufacturing process of conventional contact programmable ROM is described referring to schematic fragmentary sectional views of semiconductor substrate shown in FIGS. 3A, 3B, 4A, and 4B. In addition, a flow chart for illustrating conventional contact programmable ROM manufacturing process is shown in FIG. 5.

Process-10

First, a memory cell is manufactured prior to programming process. On a semiconductor substrate 10, a plurality of memory cells comprising a gate region 14 and source/drain regions 15A and 15B are formed. To form the plurality of memory cells, an element separation region 11 is formed on the semiconductor substrate 10, subsequently, a gate oxide film 12 comprising $SiO_2$ is formed on the surface of the semiconductor substrate. Then, a polysilicon layer 13 is formed over the whole surface, the polysilicon layer 13 is patterned to form a gate region 14 comprising a gate oxide film 12 and polysilicon layer 13. Next, on the region where source/drain regions are to be formed, an impurity is injected by ion implantation technique, the injected impurity is activated to form source/drain region 15A and 15B. As described herein above, source/drain regions 15A and 15B are formed. FIG. 3 shows two drain regions 15A and 15B of two memory cells, and the drain region 15B is common to both the memory cells. Usually, BPSG is used as an interlayer insulating layer, but BPSG is deteriorated with time significantly. Memory cells are stored for relatively long time before programming process, therefore, usually an insulating film 16 is formed over the whole surface (refer to FIG. 3A) without forming an interlayer insulating layer.

When a program is assigned and various photomask are completed, the manufacturing of contact programmable ROM restarts. TAT in the manufacturing of conventional contact programmable ROM starts at the time.

Process-20

First, an interlayer insulating layer 30 comprising BPSG is formed over the whole surface. Then, an opening 31 is formed on the interlayer insulating layer 30 above the one source/drain region 15A of a specified memory cell (refer to FIG. 3B). In the conventional contact programmable ROM, one source/drain region 15A of a memory cell which is to hold "0" level information is connected to a bit line. On the other hand, one source/drain region 15A of a memory cell which is to hold "1" level information is not connected to a bit line. Therefore, a specified memory cell herein refers to a memory cell which is to hold "0" level information.

Process-30

With recent progress of minimization, the diameter of contact hole becomes smaller. Therefore, a technique to fill consistently the internal of an opening, which is provided on the interlayer insulating layer, with metal interconnect material is the very important technical subject. Blanket tungsten CVD is one of the methods for consistent filling. In this method, tungsten is deposited by thermal CVD on the interlayer insulating layer 30 including the internal of the opening 31. Next, the tungsten deposited on the interlayer insulating layer 30 is removed selectively by etching back technique. Thereby, a metal interconnect material 32 comprising tungsten is filled in the opening 31 and a contact hole is completed (refer to FIG. 4A).

Process-40

Then, on the contact hole and interlayer insulating layer 30, for example, aluminum alloy is deposited by spattering, and the aluminum alloy layer is patterned by photolithographing and dry etching to form an interconnecting layer (refer to FIG. 4B).

In a contact programmable ROM, a gate region 14 of each memory cell is connected electrically to gate regions 14 of adjacent memory cells to form a word line. In FIG. 4, the gate region 14 is connected to gate regions of adjacent memory cells located in the perpendicular direction to the paper plane. More in detail, gate regions 14 are integrated by connecting a plurality of memory cells. Another source/drain region 15B of each memory cell is connected electrically to another source/drain regions 15B of adjacent memory cells. In FIG. 4, another source/drain region 15B is connected electrically to another source/drain regions of adjacent memory cells located in the perpendicular direction to the paper plane. More in detail, another source/drain regions 15B are integrated by connecting a plurality of memory cells. Another source/drain regions 15B are connected to Vss (GND), and the interconnecting layer 33 is equivalent to a bit line.

In the conventional manufacturing of contact programmable ROM, TAT starts from forming of contact hole described in the Process-20. As described in the Process-20, filling of opening with metal interconnect material (forming of contact hole, Process-20), which is relatively difficult process) is included in the process which relates directly to TAT of contact programmable ROM, the inclusion prevents TAT from shortening. In addition, because the number of openings to be provided should be changed depending on the program, it is difficult to stabilize the forming of contact holes.

Accordingly, the object of the present invention is to provide a method for manufacturing contact programmable ROM in which TAT is shortened and a contact hole is formed stably, and to provide a contact programmable ROM manufactured by this manufacturing method.

SUMMARY OF THE INVENTION

The object of the present invention is accomplished by providing a method for manufacturing contact programmable ROM in which whether a contact hole is connected electrically to an interconnecting layer or not corresponds to whether information exists or not, comprising the steps of:

(a) the first step in which a plurality of memory cells comprising gate region and source/drain region are formed on a semiconductor substrate, then, the first interlayer insulating layer is formed over the whole surface, the first opening is formed on the first interlayer insulating layer above one source/drain region of each memory cell, metal interconnect material is filled in the internal of the first opening to form a contact hole, subsequently, the second interlayer insulating layer is formed over the metal interconnect material and the first interlayer insulating layer, and (b) the second step in which the second opening is formed on the second interlayer insulating layer above a specified memory cell, and an interconnecting layer connected electrically to the contact hole through the second opening is formed on the second interlayer insulating layer.

In the method for manufacturing of contact programmable ROM in accordance with the present invention, a refractory metal containing tungsten as the major component is preferably used as the metal interconnect material. A contact programmable ROM of the present invention to accomplish the above mentioned object comprises;

(a) a plurality of memory cells comprising gate region and source/drain region formed on a semiconductor substrate, (b) the first interlayer insulating layer formed over the plurality of memory cells, (c) a contact hole comprising the first opening formed on the first interlayer insulating layer above the one source/drain region of each memory cell and metal interconnect material filled in the internal of the first opening, (d) an interconnecting layer connected electrically to a contact hole of specified memory cells, and (e) the second interlayer insulating layer formed over memory cells excepting the specified memory cells, in which contact memory cell whether a contact hole is connected to an interlayer connecting layer or not corresponds to whether information exists or not.

In other expression, the contact programmable ROM in accordance with the present invention to accomplish the above mentioned object is a contact programmable ROM in which a plurality of memory cells comprising gate region and drain region is arranged, a gate region of each memory cell is connected electrically to gate regions of adjacent memory cells, and one source/drain region of each memory cell is connected electrically to one source/drain regions of adjacent memory cells, and whether a contact hole is connected electrically to a interconnecting layer or not corresponds to whether information exists or not, and a contact hole is formed on another source/drain region of each memory cell, and a contact hole of a specified memory cell is connected to a common interconnecting layer, a contact hole of other memory cell is electrically insulated from the common interconnecting layer.

In the contact programmable ROM of the present invention, a refractory metal containing tungsten as the major component is used preferably as the metal interconnect material.

In the manufacturing method of contact programmable ROM in accordance with the present invention, when a program is assigned and various photomask are completed, the manufacturing of contact programmable ROM restarts. At this point of time, contact holes are already provided to each memory cell. TAT in the manufacturing process of contact programmable ROM of the present invention starts at this point of time. TAT includes only a step of forming the second opening on the second interlayer insulating layer and a step of forming of an interconnecting layer. Therefore, TAT can be shortened significantly. Because contact holes are formed previously on all memory, contact holes are formed stably.

BRIEF DESCRIPTION OF DRAWINGS

FIGS. 1A, 1B, and 1C are schematic diagrams for illustrating the manufacturing process of contact programmable ROM in accordance with the present invention.

FIGS. 2A, 2B, and 2C are schematic diagrams for illustrating the manufacturing process of contact programmable ROM in accordance with the present invention subsequent to the step in FIG. 1.

FIGS. 3A and 3B are schematic diagrams for illustrating the manufacturing process of conventional contact programmable ROM.

FIGS. 4A and 4B are schematic diagrams for illustrating the manufacturing process of conventional contact programmable ROM subsequent to the step in FIG. 3.

DETAILED DESCRIPTION OF THE PREFERRED EMBODIMENTS

Figure 5:
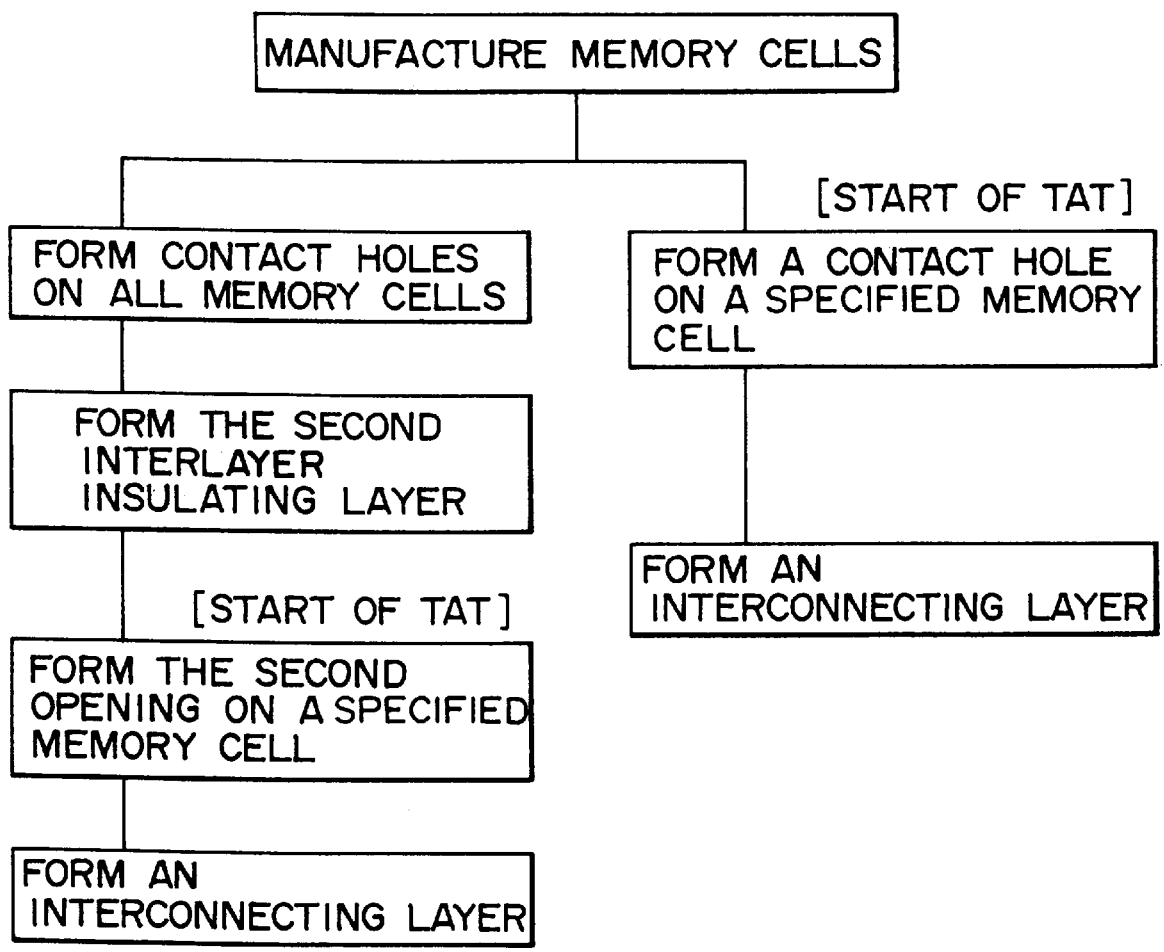
FIG. 5 is a flow chart for illustrating the manufacturing process of conventional contact programmable ROM and contact programmable ROM in accordance with the present invention for comparison.
Figure 6A:
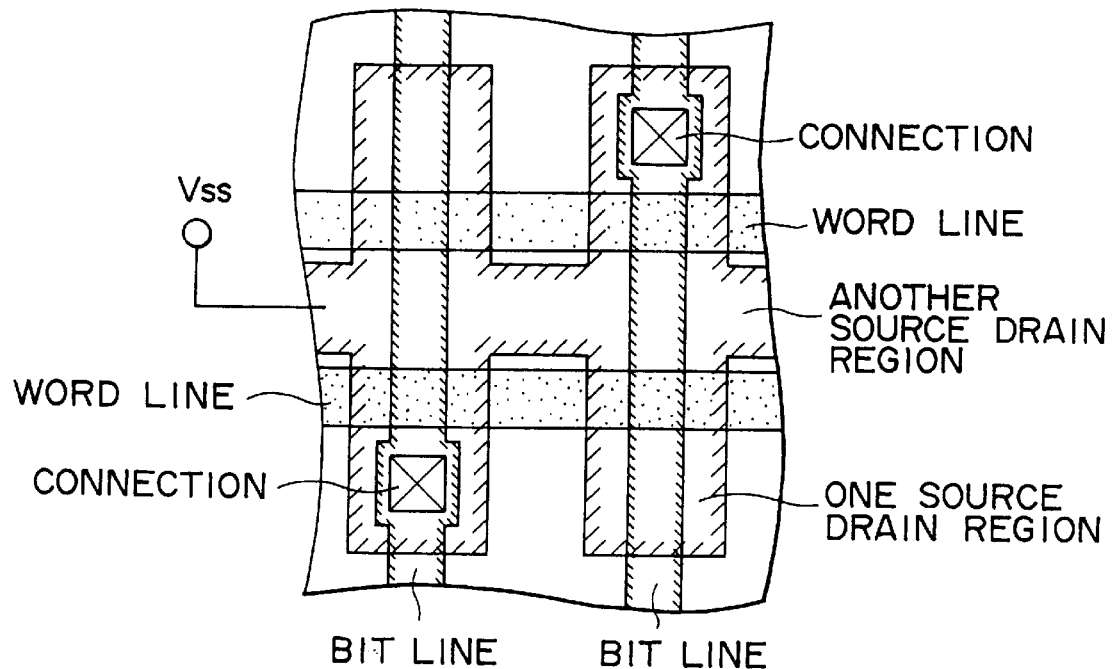
FIG. 6A is a plane view of contact programmable ROM.
Figure 6B:
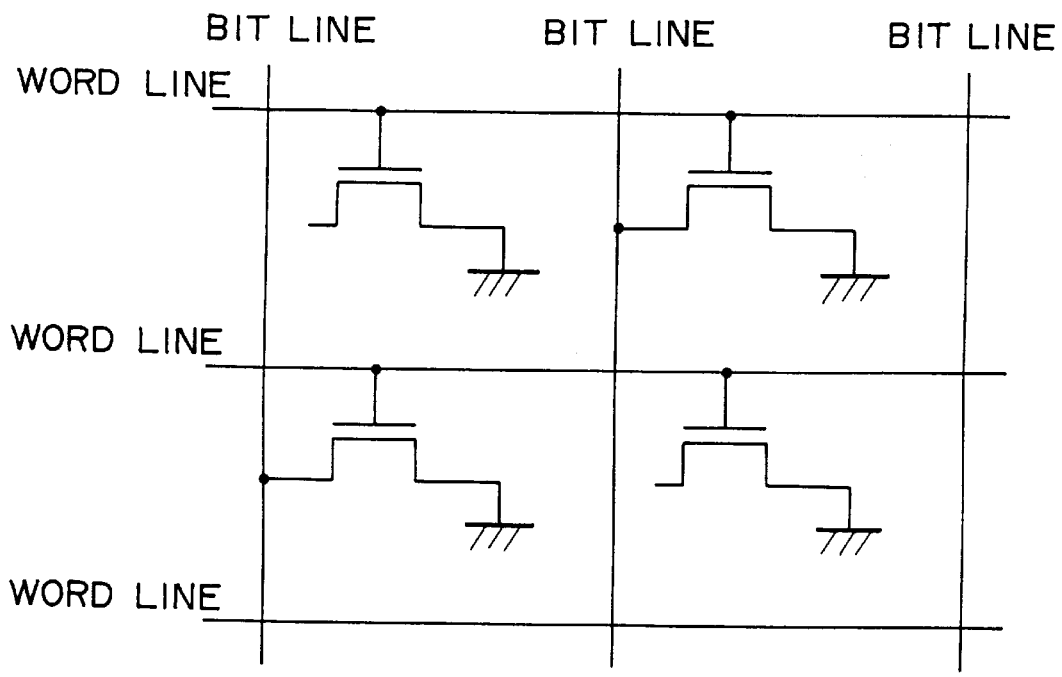
FIG. 6B is an equivalent circuit.

The present invention will be described based on embodiments referring to schematic partially sectional view of FIGS. 1A to 1C and FIGS. 2A to 2C including semiconductor substrate. The flow chart of the manufacturing process for contact programmable ROM in accordance with the present invention is shown in FIG. 5.

Process-100

First, memory cell are manufactured prior to the step of programming. A plurality of memory cell comprising respectively a gate region 14 and source/drain regions 15A and 15B are formed on a silicone substrate 10 by conventional method. For forming memories, element isolation regions 11 are formed on a semiconductor substrate 10, then, gate oxide film 12 comprising $SiO_2$ is formed on the surface of semiconductor substrate. Then, a polysilicon layer 13 is formed over the whole surface by, for example, CVD technique, and the polysilicon layer is patterned to form gate regions 14 comprising respectively a gate oxide film 12 and a polysilicon layer 13. An impurity is injected to regions where source/drain regions are to be formed by ion implantation, the implanted impurity is activated to form source/drain regions 15A and 15B (refer to FIG. 1A). Through these steps, a plurality of memory cells comprising respectively a gate region 14 and source/drain regions 15A and 15B is formed. The source/drain region 15B out of two source/drain regions of 15A and 15B of the two memory cells shown in FIG. 1 and FIG. 2 is common to both the memory cells. In FIG. 1 and FIG. 2, a plurality of memory cells are formed in the direction perpendicular to the paper plane. The gate region 14 and source/drain region 15B extends to the direction perpendicular to the paper plane, and are common to gate regions 14 and source/drain regions 151 of other memory cells located at the direction perpendicular to the paper plane. On the other hand, a source/drain region 15A are provided independently for each memory cell.

This process is the same as the process for manufacturing conventional contact programmable ROM Process-10 excepting the forming of an insulating film 16. The manufacturing process of contact programmable ROM of the present invention is different from conventional manufacturing process of contact programmable ROM in that the process proceeds to a step as described herein under prior to the assignment of a program in the case of this invention.

Process-110

The first interlayer insulating layer 20 is formed on the whole surface. The first interlayer insulating layer 20 comprises, for example, BPSG, and formed by CVD technique.

Process-120

Next, The first opening 21 is formed on the first insulating layer above the one source/drain region 15A of each memory cell (refer to FIG. 1B). The opening 21 is formed by photolithography technique and dry etching technique.

Process-130

Then, metal interconnect material 22 is filled in the first opening 21. The metal interconnect material comprises a refractory metal containing tungsten as the major component, more preferably, comprises only tungsten. First, Ti layer is formed by spattering, then, TiN layer is formed on the Ti layer by spattering. The Ti layer is provided to reduce contact resistance. On the other hand, the TiN layer is provided to function as barrier layer for preventing the reaction between the metal interconnect material and underlaid semiconductor substrate and to function as adhesion layer for improving the adhesion to the metal interconnect material. An example of forming condition of the Ti layer and TiN layer is described herein under. Forming of Ti layer Target: Ti
Process gas: Ar=35 sccm
pressure: 0.52 Pa
RF power: 2 kW
Heating of substrate: No
Forming of TiN layer
Target: Ti Process gas: $N_2$/Ar=100/35 sccm
Pressure: 1.0 Pa
RF power: 6 kW
Heating of substrate: No Next, tungsten layer is formed in the opening 21 and on the first interlayer insulating layer 20 by so-called blanket tungsten CVD technique. An example of forming condition of the tungsten layer by thermal CVD technique is described herein under.

Gas used: $WF_6$/$H_2$/Ar=40/400/2250 sccm
Pressure: 10.7 kPa
Substrate temperature: 450° C.

The tungsten layer, TiN layer, and Ti layer deposited on the first interlayer insulating layer 20 are etched back to leave metal interconnect material 22 comprising tungsten only in the opening 21. An example of etch back condition is described herein under. Tungsten layer Gas used: $SF_6$/Ar/He=100/90/5 sccm
Pressure: 46 Pa
RF power: 275 W TiN layer and Ti layer
Gas used: $Cl_2$/Ar=5/75 sccm
Pressure: 6.5 Pa
RF power: 70 W A contact hole in which metal interconnect material 22 is filled in the first opening 21 is completed for each memory cell as shown in FIG. 1C. Ti layer and TiN layer are omitted in the figure.

Process-140

Next, the second interlayer insulating layer 23 is formed over metal interconnect material 22 and the first interlayer insulating layer 20. The second interlayer insulating layer 23 comprises, for example, $SiO_2$, and is formed by CVD technique (refer to FIG. 2A).

When a program is assigned and masks are completed, the manufacturing process of contact programmable ROM is restarted. TAT in the manufacturing of contact programmable ROM of the present invention starts at this point of time, therefore, TAT is remarkably shorter than that in the conventional manufacturing.

Process-150

The second opening 24 is formed on the second interlayer insulating layer 23 above the metal interconnect material 22 which constitutes a contact hole of a specified memory cell (refer to FIG. 2B) The second opening 24 is formed by conventional photolithography technique and dry etching technique. Herein, the specified memory cell means a memory cell which is to hold "0" level information. In FIG. 1 and FIG. 2, the memory cell located on the right side out of memory cells shown in the figures is a memory cell which is to hold "0" level information. On the other hand, the memory cell located on the left side is to hold "1" level information. Therefore, the second opening is not formed above the contact hole of the memory cell located on the left side.

Process-160

Then, interconnecting layer 25 connected electrically to metallic connection material 22 which constitutes a contact hole through the second opening 24 on the second interlayer insulating layer 23 is formed (refer to FIG. 2C). More in detail, first, aluminum alloy layer comprising Al-1%Si is deposited on the second interlayer insulating layer 23 including the second opening 24 by spattering. An example of spattering condition is described herein under.

Target: Al-1%Si
Process gas: Ar=100 sccm

Pressure: 0.26 Pa

RF power: 15 W

Substrate temperature: 200° C.

Then, aluminum alloy layer is patterned by photolithography technique and dry etching technique to complete interconnecting layer 25 having a desired pattern. Herein, common source/drain regions 15B are connected to Vss (GND), common gate regions constitute a word line, and the interconnecting layer 25 constitute a bit line.

As described hereinbefore, contact programmable ROM in accordance with the present invention is manufactured. The contact programmable ROM of the present invention, as shown in FIG. 2C, comprises;

(a) a plurality of memory cells comprising respectively gate region 14 and source/drain regions 15A and 15B formed on a semiconductor substrate 10, (b) the first interlayer insulating layer 20 formed on the plurality of memory cells, (c) a contact hole comprising the first opening 21 formed on the first interlayer insulating layer 20 above one source/drain region 15A of each memory cell and metal interconnect material 22 filled in the first opening 21, (d) interconnecting layer 25 connected electrically to the contact hole of specified memory cells (In this case, the specified memory means a memory cell which is to hold "0" level information, and is a memory cell located on the right hand side in FIG. 2C), and (e) the second interlayer insulating layer 23 formed on the contact hole of memory cells excepting the specified memory cells (in this case, the memory cell excepting the specified memory cell means a memory cell which is to hold "1" level information, and is a memory cell located on the left hand side in FIG. 2C), and whether a contact hole is connected electrically to interconnecting layer corresponds to whether information exists or not.

In another expression, the contact programmable ROM of the present invention is a contact programmable ROM in which a plurality of memory cells comprising gate region 14 and source/drain regions 15A and 15B is arranged. The gate region 14 of each memory cell is connected electrically to gate regions 14 of adjacent other memory cells (in the direction perpendicular to the paper plane). One source/drain region 15B of each memory cell is connected electrically to one source/drain regions of adjacent other memory cells (located in the direction perpendicular to the paper plane). More in detail, gate regions are formed integrally, and the gate regions constitute a word line. One source/drain regions 15B are formed integrally, and one source/drain regions 15B are connected to Vss (GND).

A contact hole is formed in another source/drain region 15A of each memory cell. Contact holes of specified memory cells are electrically connected to common interconnecting layer 25 (in this case, the specified memory cell means a memory cell which is to hold "0" level information, and is the memory cell located on the right in FIG. 2C). Contact holes of another memory cells are electrically insulated from common interconnecting layer 25 (in this case, another memory cell means a memory cell which is to hold "0" level information, and is the memory cell located on the left in FIG. 2C). Whether a contact hole is electrically connected to interconnecting layer corresponds to whether information exists. Herein, the interconnecting layer 25 serves as a bit line.

Hereinbefore, the present invention is described based on preferred embodiments, this invention is by no means limited by the embodiments. Various materials, conditions, and values used in the description of the embodiments are only for example, and variations may be made by one skilled in the art. The arrangement of the plurality of memory cells is only for example, and variations design may be made by one skilled in the art. The metal interconnect material is not limited to tungsten, for example, polysilicon may be used. As the first and second interlayer insulating layer, conventional insulating materials such as PSG, BSG, ASSG, PbSG, SbSG, SOG, and SiON, or laminated insulated film of these insulating material may be used besides BPSG and $SiO_2$. The aluminum alloy layer may comprises various aluminum alloys such as pure aluminum, Al-Cu, Al-Si-Cu, Al-Ge, and Al-Si-Ge. For the interconnecting layer, Cu alloys may be used besides aluminum alloys.

Figure 7:
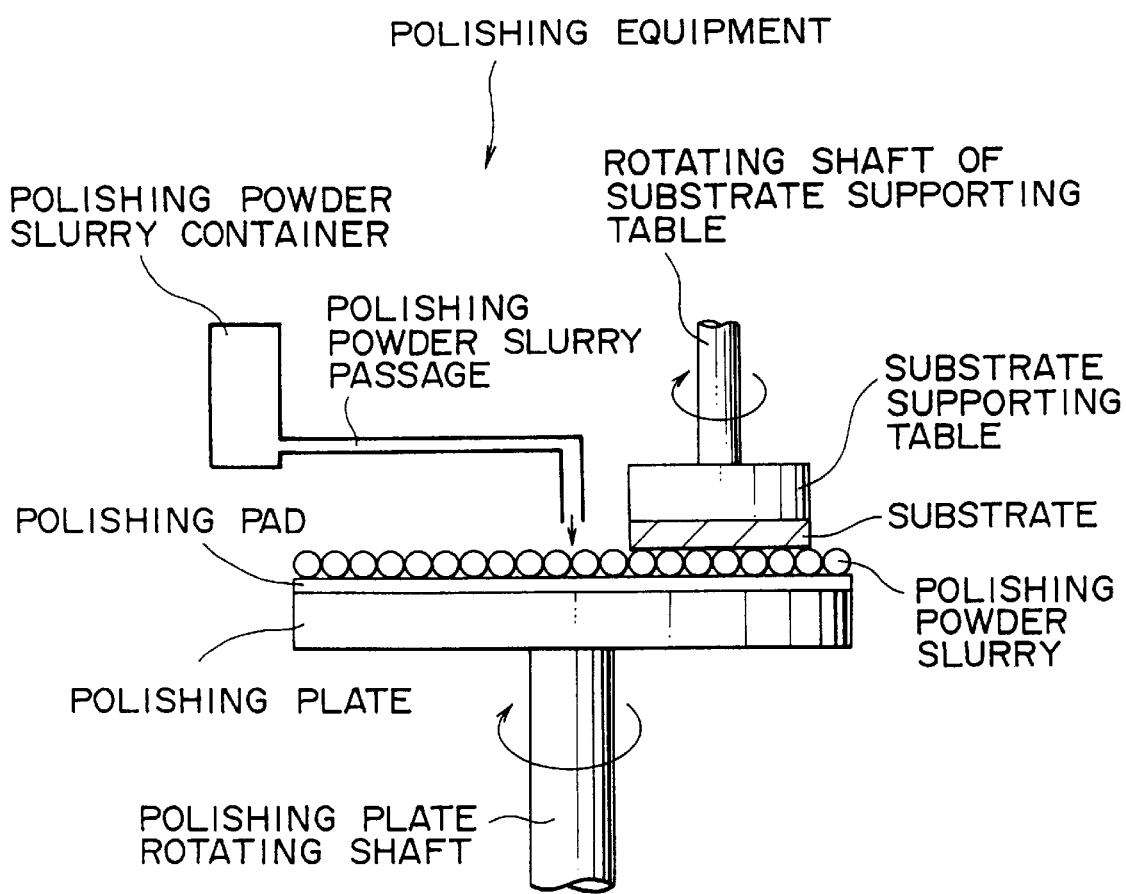
FIG. 7 is a schematic diagram of a polishing equipment suitable for chemical and mechanical polishing.

In the embodiments, the internal of openings are filled with metal interconnect material by so-called blanket tungsten CVD technique, but in other way, the internal of openings may be filled by a two step process, for example, in which tungsten layer is formed over the second interlayer insulating layer including openings by thermal CVD technique, then the tungsten layer on the second interlayer insulating layer is selectively removed by chemical and mechanical polishing process (CMP technique). A schematic diagram of a polishing equipment suitable for chemical and mechanical polishing is shown in FIG. 7. An example of operational condition for CMP is listed herein under.

Polishing plate rpm: 37 rpm

Substrate supporting table rpm: 17 rpm

Polishing pressure: 5.5×108 Pa

Pad temperature: 40° C.

Used polishing slurry: $K_4Fe(CN)_6$ aqueous solution

The polishing equipment shown in FIG. 7 comprises a polishing plate, substrate supporting table, and polishing slurry supply. The polishing plate is supported by the polishing plate rotating shaft, and on the surface thereof a polishing pad is placed. The substrate supporting table is provided above the polishing plate, and supported by the rotating shaft of substrate supporting table. A substrate to be polished is placed on the substrate supporting table. The rotating shaft of substrate supporting table is connected to the polishing pressure adjusting mechanism (not shown in the figure) which is to push the substrate supporting table against the polishing pad. Polishing slurry containing polishing powder is fed from the polishing powder slurry supply system to the pad. For CMP, a polishing equipment as described herein is used. The polishing plate is rotated while slurry which contains polishing powder is being fed. Polishing pressure of the substrate against the polishing pad is adjusted by the polishing pressure adjusting mechanism while the substrate placed on the substrate supporting table is being rotated. The surface of a substrate is polished as described herein above.

In another way, the inside of openings is filled with metal interconnect material by selective tungsten CVD technique in stead of blanket tungsten CVD technique. An example of operational condition for this case is described herein under.

Used gas: $WF_6/SiH_4/H_2/Ar=10/7/1000/10$ sccm

Temperature: 260° C.

Pressure: 26 Pa

Film is formed by spattering technique using various types of spattering equipment such as magnetron spattering equipment, DC spattering equipment, RF spattering equipment, ECR spattering equipment, and bias spattering equipment in which substrate bias is applied. In the manufacturing process of contact programmable ROM in accordance with the present invention, TAT includes only a step for forming the second opening on the second interlayer insulating layer and a step for forming interconnecting layer, thereby, TAT is shortened significantly. In addition, the step for forming contact holes, which step is the most difficult step in the manufacturing process of contact programmable ROM and often restricts the production capacity, is not included in TAT, thereby, TAT is stabilized. In addition, contact holes are formed previously on all memory cells, thereby, contact holes are formed consistently.

What is claimed is:

1. A mask programmable read-only-memory device comprising a plurality of memory cells formed on a semiconductor substrate arranged in rows and columns to form an array, each of said memory cells further comprising a control electrode serving as a word line and first and second regions having a conductivity different from that of said substrate, said device comprising:

a first insulating layer formed over a plurality of memory cells;

a plurality of first contact holes electrically connected to a corresponding plurality of said first regions formed in said first insulating layer;

a conductive material filling each of said first contact holes;

a second insulating layer formed on said conductive material and said first insulating layer;

second contact holes in said second insulating layer formed over select ones of said first contact holes, said second contact holes filled with conductive material which is electrically connected to the conductive material in the corresponding select first contact hole; and an interconnecting layer serving as a bit line formed over said second insulating layer for connecting said conductive material through said second contact holes wherein memory cells connected to respective ones of said second contact holes are defined to be of a first logic state and memory cells which are not connected to said second contact holes are defined to be of a second logic state.

2. A programmable read only memory device as claimed in claim 1, wherein said conductive material in said second holes comprises a refractory metal containing tungsten as a major component.

3. A programmable read only memory device as claimed in claim 1, wherein a barrier layer is formed under said metal interconnect material.

4. A programmable read only memory device as claimed in claim 3, wherein said barrier layer comprises a Ti layer and TiN layer formed on the Ti layer.

5. A programmable read only memory device as claimed in claim 1, wherein a first memory cell of said plurality of memory cells is a memory for holding "1" level information and a second memory cell is a memory for holding "0" level information.

6. A programmable read only memory device as claimed in claim 1, wherein said interconnecting layer comprises aluminum or aluminum alloy.

7. A programmable read only memory device as claimed in claim 5, wherein said first and said second memory cells have a common source/drain region.

* * * * *